United States Patent
Roberts et al.

(10) Patent No.: US 7,534,693 B2
(45) Date of Patent: May 19, 2009

(54) THIN-FILM CAPACITOR WITH A FIELD MODIFICATION LAYER AND METHODS FOR FORMING THE SAME

(75) Inventors: Douglas R. Roberts, Austin, TX (US); Eric D. Luckowski, Round Rock, TX (US); Shahid Rauf, Pflugerville, TX (US); Peter L. G. Ventzek, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 180 days.

(21) Appl. No.: 11/326,524

(22) Filed: Jan. 4, 2006

(65) Prior Publication Data

US 2007/0155113 A1 Jul. 5, 2007

(51) Int. Cl.
*H01L 21/20* (2006.01)
(52) U.S. Cl. .................. 438/396; 438/393; 438/239; 257/E21.008; 257/E21.021
(58) Field of Classification Search ............... 438/381, 438/396, 3, 295, 253; 257/E21.001, E21.009
See application file for complete search history.

(56) References Cited

U.S. PATENT DOCUMENTS

| | | | | |
|---|---|---|---|---|
| 5,504,041 A | * | 4/1996 | Summerfelt | 438/396 |
| 5,554,564 A | * | 9/1996 | Nishioka et al. | 438/396 |
| 6,025,257 A | * | 2/2000 | Jeon | 438/608 |
| 6,344,964 B1 | * | 2/2002 | Adler | 361/306.3 |
| 6,379,977 B1 | * | 4/2002 | Sun et al. | 438/3 |
| 6,414,344 B1 | * | 7/2002 | Kweon | 257/295 |
| 6,670,256 B2 | * | 12/2003 | Yang et al. | 438/396 |
| 6,825,081 B2 | | 11/2004 | Zheng | |
| 6,831,319 B2 | | 12/2004 | Zheng | |
| 6,897,105 B1 | * | 5/2005 | Wilk et al. | 438/240 |
| 6,927,121 B2 | * | 8/2005 | Oh et al. | 438/240 |
| 2003/0096473 A1 | * | 5/2003 | Shih et al. | 438/240 |
| 2003/0211687 A1 | * | 11/2003 | Lee | 438/253 |

FOREIGN PATENT DOCUMENTS

JP 2000022083 A * 1/2000

* cited by examiner

*Primary Examiner*—W. David Coleman
*Assistant Examiner*—Shaka Scarlett

(57) ABSTRACT

A method for forming a capacitor includes providing a metal-containing bottom electrode, forming a capacitor insulator over the metal-containing bottom electrode, forming a metal-containing top electrode over the capacitor insulator, and forming a dielectric-containing field modification layer over the capacitor insulator and at least partially surrounding the metal-containing top electrode. Forming the dielectric-containing field modification layer may include oxidizing a sidewall of the metal-containing field modification layer. A barrier layer may be formed over the capacitor insulator prior to forming the metal-containing top electrode.

20 Claims, 4 Drawing Sheets

US 7,534,693 B2

THIN-FILM CAPACITOR WITH A FIELD MODIFICATION LAYER AND METHODS FOR FORMING THE SAME

BACKGROUND OF THE INVENTION

1. Field of the Invention

This invention relates in general to thin-film capacitors and more specifically to a thin-film capacitor with a field modification layer and methods for forming the same.

2. Description of the Related Art

Thin-film capacitors increasingly have thinner insulator and electrode layers. Thinning of the insulator layer, however, poses several problems in such capacitors. In particular, enhanced electric field at the corners of the electrode layers can generate higher leakage current at the periphery of the thin-film capacitors. In certain instances, leakage current can be large enough to cause insulator breakdown at the electrode layer edges. Insulator breakdown is more likely to happen in thin-film capacitors with thinner insulator layers. Susceptibility to insulator breakdowns lowers the reliability of thin-film capacitors.

Thus, there is a need for improved thin-film capacitors and methods for forming the same.

BRIEF DESCRIPTION OF THE DRAWINGS

The present invention may be better understood, and its numerous objects, features, and advantages made apparent to those skilled in the art by referencing the accompanying drawings.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following sets forth a detailed description of a mode for carrying out the invention. The description is intended to be illustrative of the invention and should not be taken to be limiting.

In one aspect, a method for forming a capacitor, such as a thin-film capacitor, is provided. The method may include providing a metal-containing bottom electrode and forming a capacitor insulator over the metal-containing bottom electrode. The method may further include forming a metal-containing top electrode layer over the capacitor insulator. The method may further include forming a dielectric-containing field modification layer over the capacitor insulator and at least partially surrounding the metal-containing top-electrode.

In another aspect, a method for forming a capacitor, such as a thin-film capacitor is provided. The method may include providing a bottom electrode and forming a capacitor insulator over the bottom electrode. The method may further include forming a metal-containing top electrode over the capacitor insulator. The method may further include oxidizing a sidewall region of the metal-containing top electrode to form an oxide-containing field modification layer at least partially surrounding the metal-containing top electrode.

In yet another aspect, a capacitor comprising a metal-containing bottom electrode and a capacitor insulator over the metal-containing bottom electrode is provided. The capacitor may further include a metal-containing top electrode over the capacitor insulator. The capacitor may further include a dielectric-containing field modification layer over the capacitor insulator and at least partially surrounding the metal-containing top electrode.

Figure 1:
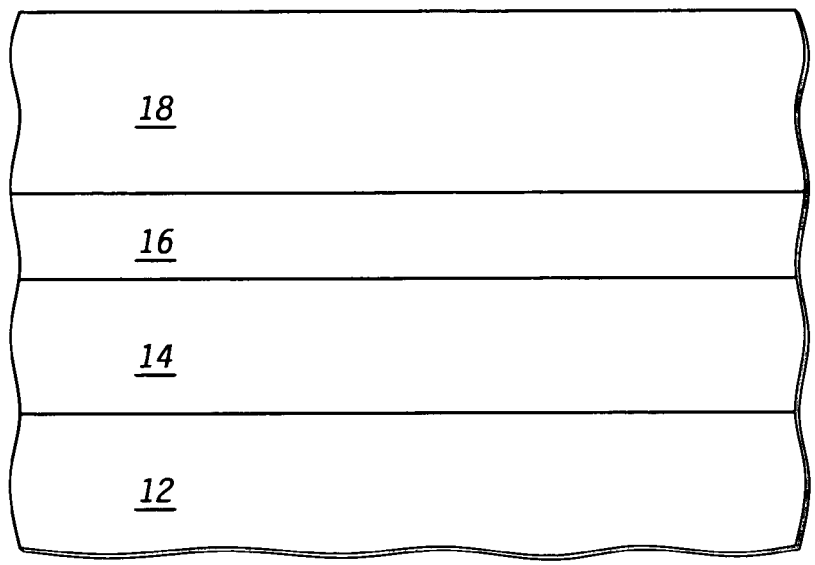
FIG. 1 shows a partial side view of one embodiment of a thin-film capacitor during a processing stage, consistent with one embodiment of the invention.

FIG. 1 shows a partial side view of one embodiment of a thin-film capacitor 10, such as a metal-insulator-metal (MIM) or a metal-insulator-silicon (MIS) capacitor during a processing stage. Thin-film capacitor 10 may be formed of layers, including a bottom electrode layer 12, a capacitor insulator layer 14, a barrier layer 16, and a top electrode layer 18. These layers may be formed by plasma vapor deposition, chemical vapor deposition, or atomic layer deposition techniques. Alternatively, these layers may be epitaxially grown, using atomic layer epitaxy, for example. Although FIG. 1 shows barrier layer 16 as part of thin-film capacitor 10, barrier layer 16 may not be formed as part of thin-film capacitor 10. Additional layers may be formed as part of thin-film capacitor 10, if necessary. Bottom electrode layer 12 and top electrode layer 18 may be metal or silicon containing layers. By way of example, the metal containing layer may include tantalum, tantalum nitride, titanium, titanium nitride, or aluminum. In addition, each of bottom electrode layer 12 and top electrode layer 18 may be a laminated structure. Capacitor insulator layer 14 may be formed using materials, such as silicon dioxide, silicon nitride, tantalum pentoxide, or hafnium oxide. Capacitor insulator layer 14 may comprise a laminate structure, as well. Barrier layer 16 may be formed using materials, such as hafnium oxide or aluminum oxide. By way of example, barrier layer 16 may be 10-100 Angstroms thick. Although barrier layer 16 is shown separately from capacitor insulator layer 14, barrier layer 16 may be formed as part of capacitor insulator layer 14. Barrier layer 16 may act as an etch stop layer during the etching of top electrode layer 18. In addition, although FIG. 1 shows a planar structure, thin-film capacitor 10 may be non-planar.

Figure 2:
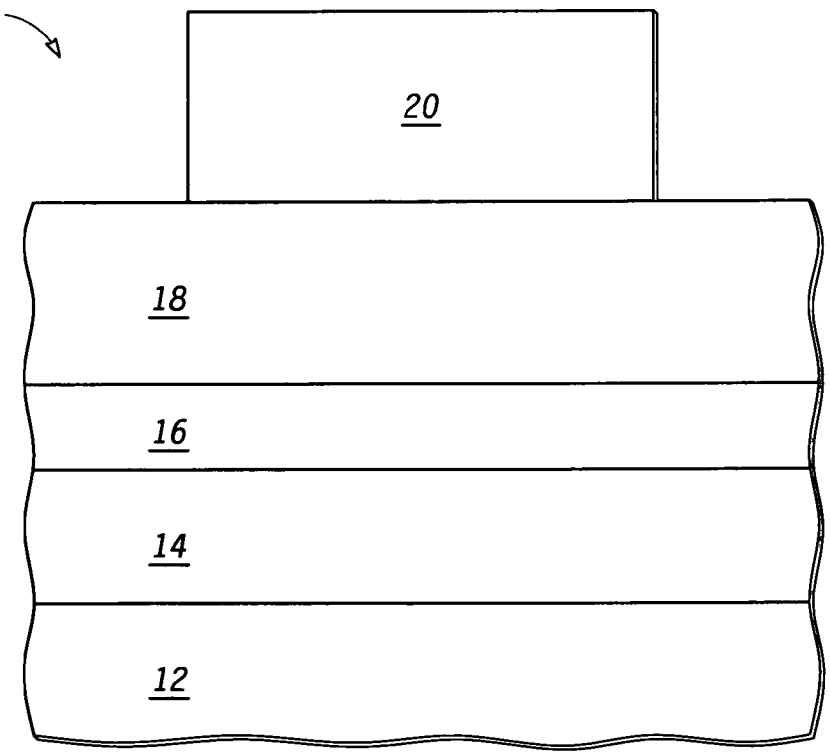
FIG. 2 shows a partial side view of one embodiment of a thin-film capacitor during a processing stage, consistent with one embodiment of the invention.
Figure 3:
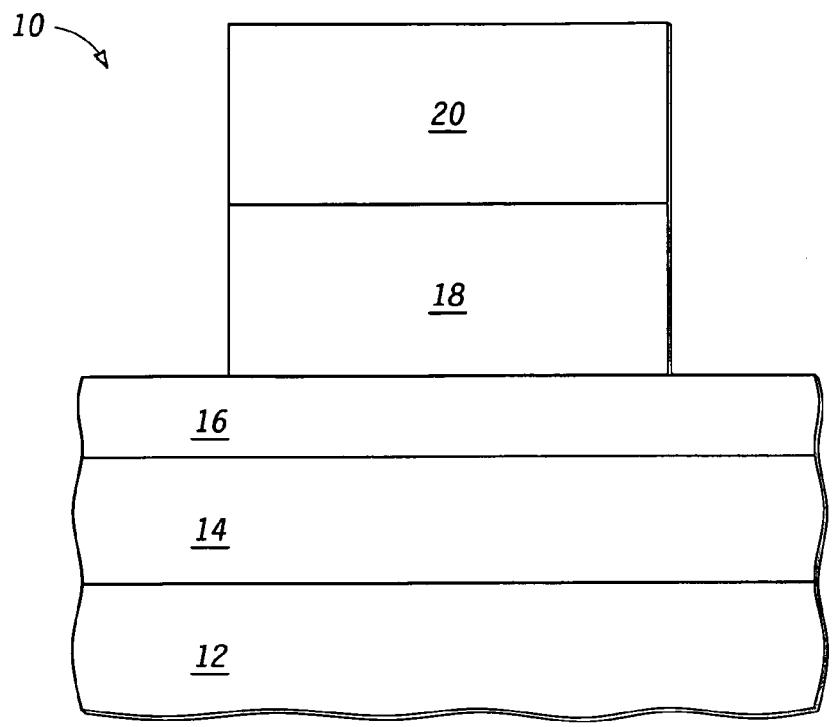
FIG. 3 shows a partial side view of one embodiment of a thin-film capacitor during a processing stage, consistent with one embodiment of the invention.
Figure 4:
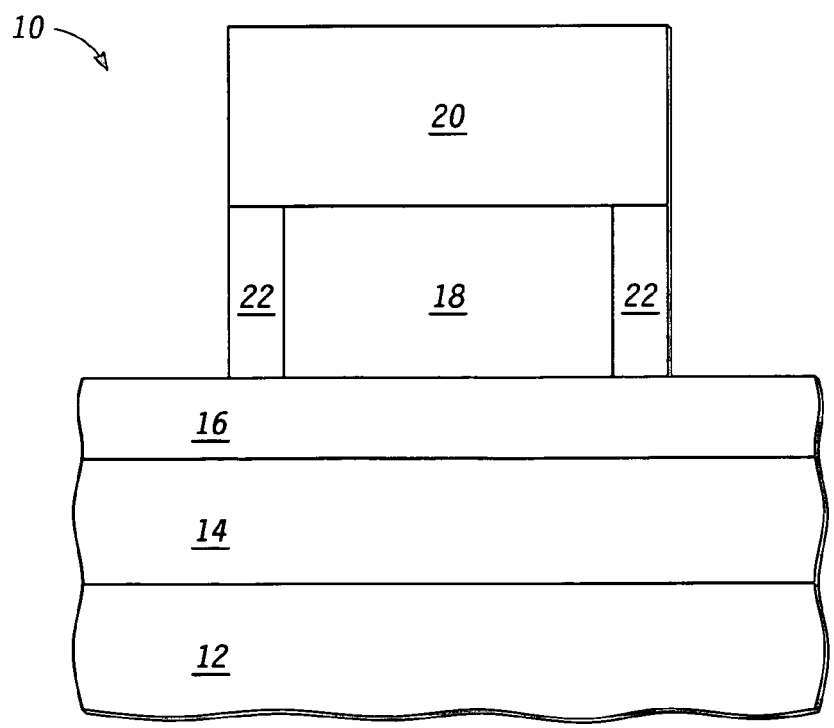
FIG. 4 shows a partial side view of one embodiment of a thin-film capacitor during a processing stage, consistent with one embodiment of the invention.
Figure 5:
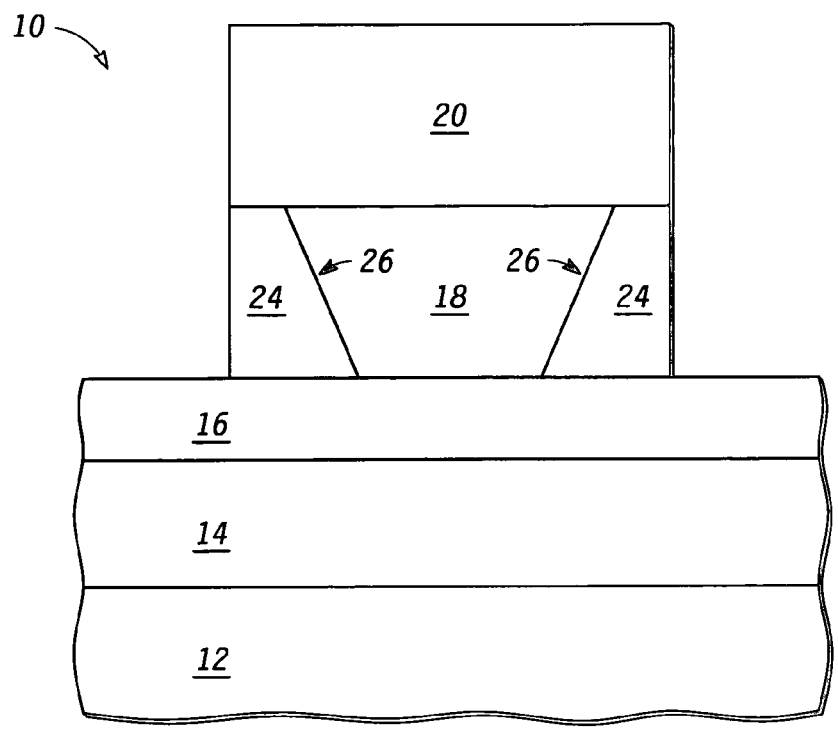
FIG. 5 shows a side view of one embodiment of a thin-film capacitor during a processing stage, consistent with one embodiment of the invention.

As shown in FIG. 2, as part of the next processing step, a patterned masking layer 20 may be formed on top of top electrode layer 18. Next, as shown in FIG. 3, the exposed portion of top electrode layer 18 may be etched away. As part of the next processing step, as shown in FIG. 4, a field modification layer 22 may be formed on each side of top electrode layer 18 by oxidizing a sidewall on each side of top electrode layer 18. By way of example, field modification layer 22 may reduce the strength of an electric field along the corners of capacitor insulator layer 14. Oxidation may be performed by exposure to oxygen and/or ozone containing plasma at a temperature of 200-400 degree Celsius. Oxidation of top electrode layer 18 may be performed by free radicals of Oxygen. By way of example, a remote plasma oxidation process may be used as part of this step. Oxidation may be performed during or after the etching of top electrode layer 18. Thus, as shown in FIG. 4, field modification layer 22 may be formed on top of barrier layer 16 and may at least partially surround top electrode layer 18. Alternatively, field modification layer 22 may be formed on top of capacitor insulator layer 14. By way of example, field modification layer 22 may be at least thicker than 100 Angstroms. Although FIG. 4 shows field modification layer 22 having the same height as top electrode layer 18, field modification layer 22 may have a lower height than top electrode layer 18. Furthermore, although FIG. 4 shows a field modification layer 22 that is uniform in width, it may have a non-uniform width. Specifically, referring now to FIG. 5, an edge 26 between field modification layer 24 and top electrode layer 18 may be at an angle with respect to a top surface of barrier layer 16 and/or capacitor insulator layer 14. By way of example, oxidation of a sidewall region of top electrode layer 18 may result in a boundary between field modification layer 24 and top electrode layer 18, such that the boundary forms an angle with respect to a bottom surface of top electrode layer 18 and the angle facing top electrode layer 18 is greater than 90 degrees.

Figure 6:
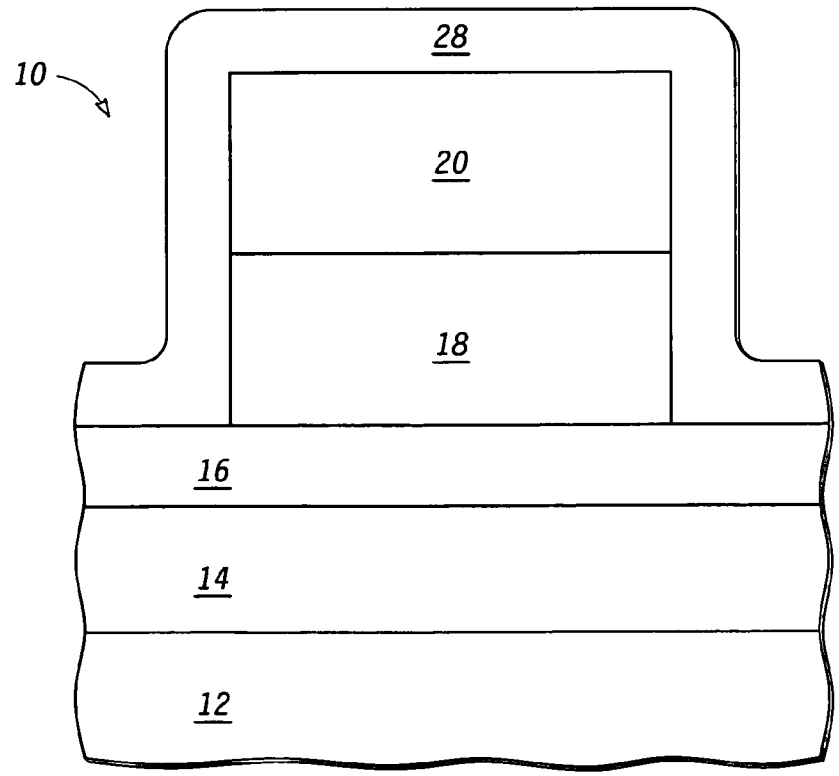
FIG. 6 shows a partial side view of one embodiment of a thin-film capacitor during a processing stage, consistent with one embodiment of the invention.
Figure 7:
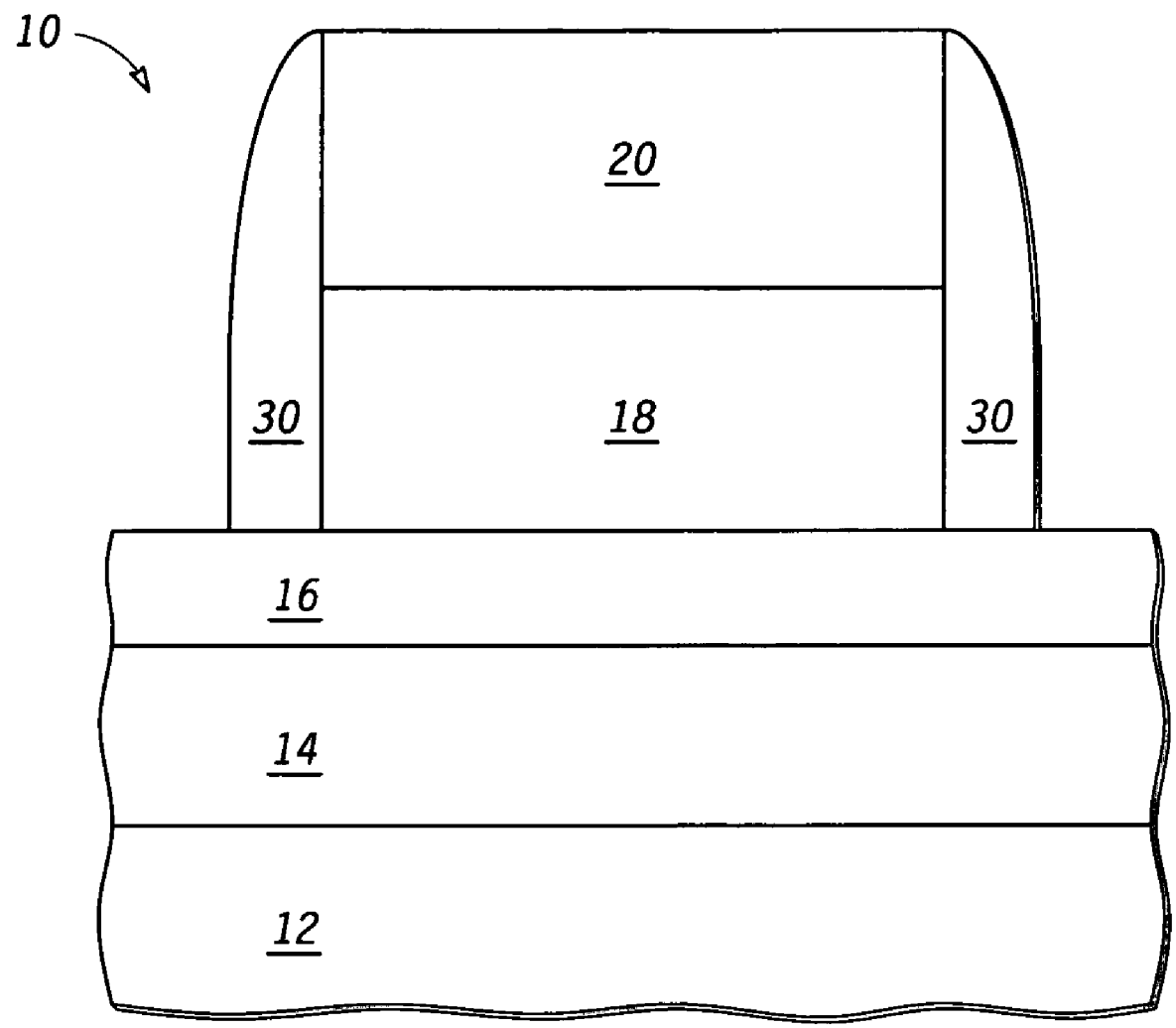
FIG. 7 shows a partial cross-sectional side view of one embodiment of a wafer during another stage in its manufacture, consistent with one embodiment of the invention.

FIG. 6 shows a partial side view of one embodiment of a thin-film capacitor during a processing stage, consistent with one embodiment of the invention. As part of this step, after the step shown in FIG. 3, a dielectric-containing layer 28 may be deposited on top of barrier layer 16 and patterned masking layer 20. Dielectric-containing layer 28 may be deposited using chemical vapor deposition or atomic layer deposition. Next, as shown in FIG. 7, dielectric-containing layer 28 may be anisotropically etched to form field modification layer 30.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a capacitor comprising:
   providing a workpiece having a first electrode;
   forming a capacitor insulator layer over the first electrode;
   forming an etch-stop layer over the capacitor insulator layer, wherein the etch-stop layer comprises an insulating material;
   forming a metal-containing layer over the etch-stop layer;
   etching the metal-containing layer to define a second electrode having a sidewall, wherein etching is terminated before exposing the capacitor insulator layer; and
   exposing the workpiece to an oxidizing ambient after etching the metal-containing layer, wherein during exposing the workpiece to the oxidizing ambient, substantially all of the capacitor insulator layer is covered by the etch-stop layer, and after exposing the workpiece to the oxidizing ambient, a dielectric-containing field modification layer overlies the capacitor insulator and etch-stop layers and at least partially surrounds the second electrode.

2. The process of claim 1, wherein the etch-stop layer comprises a barrier layer.

3. The process of claim 2, wherein the etch-stop layer comprises an oxide.

4. The process of claim 3, wherein the etch-stop layer comprises hafnium oxide or aluminum oxide.

5. The process of claim 1, wherein the dielectric-containing field modification layer comprises tantalum pentoxide, tantalum oxynitride, titanium oxide, titanium oxynitride, aluminum oxide, or aluminum oxynitride.

6. The process of claim 4, wherein the capacitor insulator layer comprises silicon dioxide, silicon nitride, tantalum pentoxide, or hafnium oxide.

7. The process of claim 1, wherein exposing the workpiece to the oxidizing ambient is performed using a plasma oxidation.

8. The method of claim 7, wherein the plasma oxidation is performed at a temperature in a range of approximately 200 to 400 degrees Celsius.

9. The method of claim 1, wherein exposing the workpiece to the oxidizing ambient is performed using an oxygen or ozone source that produces free radicals.

10. The method of claim 1, wherein exposing the workpiece to the oxidizing ambient comprises oxidizing a sidewall of the second electrode to form the dielectric-containing field modification layer.

11. The method of claim 1, wherein exposing the workpiece to the oxidizing ambient results in a boundary between the dielectric-containing field modification layer and the second electrode, wherein the boundary forms an angle with respect to a bottom surface of the second electrode, the angle facing the second electrode and being greater than 90 degrees.

12. The method of claim 1, wherein forming the dielectric-containing field modification layer has a thickness of at least 100 Angstroms.

13. The method of claim 12, wherein the etch-stop layer has a thickness in a range of 10 to 100 Angstroms.

14. A method of forming a capacitor comprising:
   providing a workpiece having a first electrode;
   forming a capacitor insulator layer over the first electrode;
   forming an etch-stop layer over the capacitor insulator layer, wherein the etch-stop layer comprises an insulating barrier layer, wherein the etch-stop layer has a different composition as compared to the capacitor insulator layer;
   forming a metal-containing layer over the etch-stop layer;
   etching the metal-containing layer to define a second electrode, wherein etching is terminated before exposing the capacitor insulator layer; and
   oxidizing a sidewall of the second electrode to form an oxide-containing field modification layer that overlies the capacitor insulator and etch-stop layers and at least partially surrounds the second electrode, wherein during oxidizing, substantially all of the capacitor insulator layer is covered by the etch-stop layer.

15. The method of claim 14, wherein the oxide-containing field modification layer comprises tantalum pentoxide, tantalum oxynitride, titanium oxide, titanium oxynitride, aluminum oxide, or aluminum oxynitride.

16. The method of claim 15, wherein the capacitor insulator layer comprises silicon dioxide, silicon nitride, tantalum pentoxide, or hafnium oxide.

17. The method of claim 16, wherein the etch-stop layer comprises hafnium oxide or aluminum oxide.

18. The method of claim 14, wherein oxidizing the sidewall of the second electrode is performed using a plasma oxidation at a temperature in a range of approximately 200 to 400 degrees Celsius.

19. The method of claim 14, wherein oxidizing the sidewall of the second electrode is performed using an oxygen or ozone source that produces free radicals.

20. The method of claim 14, wherein oxidizing the sidewall of the second electrode results in a boundary between the oxide-containing field modification layer and the second electrode, wherein the boundary forms an angle with respect to a bottom surface of the second electrode, the angle facing the second electrode and being greater than 90 degrees.

* * * * *